(12) United States Patent
Takaba

(10) Patent No.: US 11,538,900 B1
(45) Date of Patent: Dec. 27, 2022

(54) SEMICONDUCTOR DEVICE AND METHOD OF FABRICATING THE SAME

(71) Applicant: Winbond Electronics Corp., Taichung (TW)

(72) Inventor: Hiroyuki Takaba, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/341,416

(22) Filed: Jun. 8, 2021

(51) Int. Cl.
*H01L 49/02* (2006.01)
*H01L 27/108* (2006.01)

(52) U.S. Cl.
CPC ........ *H01L 28/87* (2013.01); *H01L 27/10817* (2013.01); *H01L 28/40* (2013.01); *H01L 28/82* (2013.01); *H01L 28/84* (2013.01); *H01L 28/91* (2013.01); *H01L 27/108* (2013.01); *H01L 27/10852* (2013.01)

(58) Field of Classification Search
CPC ......... H01L 28/40; H01L 28/82; H01L 28/84; H01L 28/90–92; H01L 27/108; H01L 27/10817; H01L 28/87
See application file for complete search history.

(56) References Cited

U.S. PATENT DOCUMENTS

| | | | | |
|---|---|---|---|---|
| 7,355,234 | B2 * | 4/2008 | Hoshino | H01L 28/90 257/E21.651 |
| 2003/0227802 | A1 * | 12/2003 | Aochi | H01L 28/91 257/E27.088 |
| 2013/0277724 | A1 * | 10/2013 | Jun | H01L 27/10852 257/296 |
| 2020/0111684 | A1 | 4/2020 | Choi et al. | |
| 2021/0151461 | A1 | 5/2021 | Shim et al. | |

FOREIGN PATENT DOCUMENTS

| | | |
|---|---|---|
| CN | 107634047 | 1/2018 |
| CN | 110752202 | 2/2020 |
| TW | I718859 | 2/2021 |

OTHER PUBLICATIONS

"Office Action of Taiwan Counterpart Application", dated Sep. 19, 2022, p. 1-p. 8.

* cited by examiner

*Primary Examiner* — Jose R Diaz
(74) *Attorney, Agent, or Firm* — JCIPRNET

(57) ABSTRACT

A semiconductor device includes a landing pad and a capacitor disposed on and electrically connected to the landing pad. The capacitor includes a cylindrical bottom electrode, a dielectric layer and a top electrode. The cylindrical bottom electrode is disposed on an in contact with the landing pads, wherein an inner surface the cylindrical bottom electrode includes a plurality of protruding portions, and an outer surface of the cylindrical bottom electrode includes a plurality of concaved portions. The dielectric layer is conformally disposed on the inner surface and the outer surface of the cylindrical bottom electrode, and covering the protruding portions and the concaved portions. The top electrode is conformally disposed on the dielectric layer over the inner surface and the outer surface of the cylindrical bottom electrode.

10 Claims, 22 Drawing Sheets

SEMICONDUCTOR DEVICE AND METHOD OF FABRICATING THE SAME

BACKGROUND

Technical Field

The present disclosure relates to a semiconductor device. In particular, relates to a semiconductor device having a capacitor, and a method of fabricating the same.

Description of Related Art

In conventional dynamic random-access memory (DRAM) devices, a capacitor is used as a storage element to store digital data. For example, writing digital data is performed by the steps of charging and discharging the capacitor. The increase in capacitance of metal-insulator-metal (MIM) capacitors is well known to improve the refresh performance in DRAM fabrication. In order to obtain high capacitance density, various processing steps for increasing the surface area of the capacitors, decreasing the dielectric thickness, and/or increasing the permittivity of dielectric films have been proposed.

SUMMARY

The present disclosure provides a semiconductor device and a method of fabricating the same, whereby a surface area of a capacitor in the semiconductor device is significantly increased for increasing the capacitance thereof.

An embodiment of the invention provides a semiconductor device including a landing pad and a capacitor. The capacitor is disposed on and electrically connected to the landing pads, wherein the capacitor includes a cylindrical bottom electrode, a dielectric layer and a top electrode. The cylindrical bottom electrode is disposed on and in contact with the landing pads, wherein an inner surface the cylindrical bottom electrode comprises a plurality of protruding portions, and an outer surface of the cylindrical bottom electrode comprises a plurality of concaved portions. The dielectric layer is conformally disposed on the inner surface and the outer surface of the cylindrical bottom electrode, and covering the plurality of protruding portions and the plurality of concaved portions of the cylindrical bottom electrode. The top electrode is conformally disposed on the dielectric layer over the inner surface and the outer surface of the cylindrical bottom electrode.

An embodiment of the invention further provides a method of fabricating a semiconductor device. The method includes the following steps. A landing pad is provided. Supporting layers and oxide layers are alternatingly formed over the landing pad. The supporting layers and the oxide layers are patterned to form a cylindrical opening, wherein the supporting layers are patterned to form a supporting structure. A plurality of island structures is formed over the supporting structure and the oxide layers, and formed on sidewalls of the cylindrical opening. A conductive layer is conformally formed over the plurality of island structures and within the cylindrical opening. The conductive layer is patterned to form a cylindrical bottom electrode, wherein an inner surface the cylindrical bottom electrode comprises a plurality of protruding portions, and an outer surface of the cylindrical bottom electrode comprises a plurality of concaved portions. The oxide layers are stripped off and the plurality of island structures not covered by the supporting structure is removed. A dielectric layer is conformally formed on the inner surface and the outer surface of the cylindrical bottom electrode, and covering the plurality of protruding portions and the plurality of concaved portions of the cylindrical bottom electrode. A top electrode is conformally formed on the dielectric layer over the inner surface and the outer surface of the cylindrical bottom electrode.

To make the aforementioned more comprehensible, several embodiments accompanied with drawings are described in detail as follows.

DESCRIPTION OF THE EMBODIMENTS

The methods described in the following embodiments may be regarded as a method of fabricating a semiconductor device. The semiconductor device may be a landing pad and a capacitor of a dynamic random-access memory (DRAM) device, but the invention is not limited thereto.

Figure 1A:
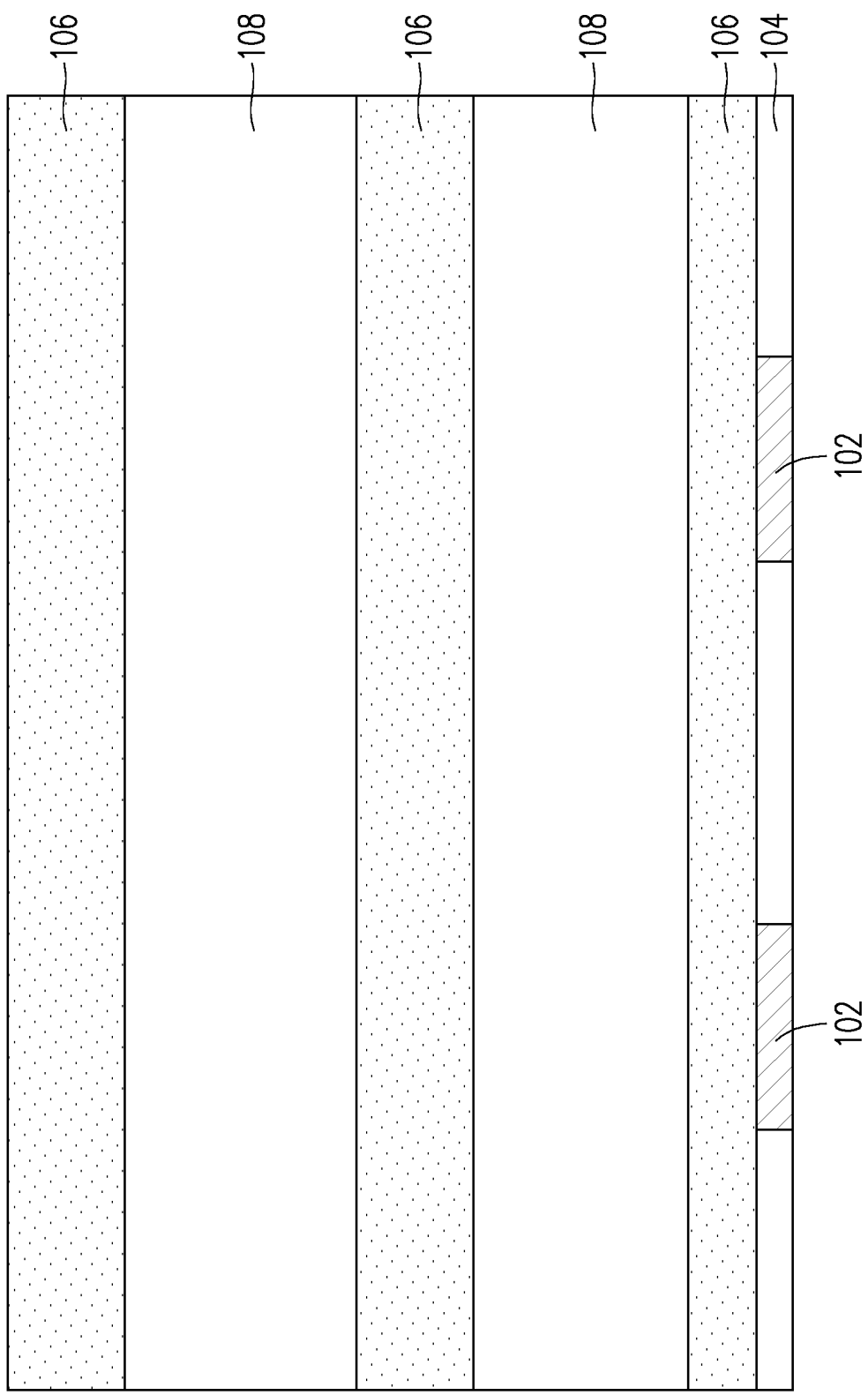
FIGS. 1A-1I, 2A-2H and 3A-3E are schematic sectional and top views in a method of fabricating a semiconductor device in accordance with three different embodiments of the present disclosure.

FIG. 1A to FIG. 1I are schematic sectional and top views in a method of fabricating a semiconductor device in accordance with a first embodiment of the present disclosure. Referring to FIG. 1A, landing pads 102 are provided. The landing pads 102 may be conductive pads that are located over a substrate (not shown) of the semiconductor device. A material of the landing pads 102 may include TiN, TaN, W, TiW, Al, Cu, silicide, Ru, or Pt, and the landing pads 102 are embedded or surrounded by a dielectric layer 104. The dielectric layer 104 may include materials such as silicon oxide, silicon nitride, poly-Si, or the like, or a combination thereof. Furthermore, a top surface of the landing pads 102 may be substantially coplanar with a top surface of the dielectric layer 104.

As illustrated in FIG. 1A, a plurality of supporting layers 106 and a plurality of oxide layers 108 are alternatingly formed over the landing pads 102 and on the dielectric layer 104. In other words, the plurality of oxide layers 108 are separated from one another by the supporting layers 106, while the plurality of supporting layers 106 are separated from one another by the oxide layers 108. Besides, the material of the supporting layers 106 are made of silicon nitride while the oxide layers 108 are made of silicon oxide, and the top layer of the stack is the supporting layer 106. However, the disclosure is not limited thereto. In other embodiments, the supporting layers 106 may be made of any materials having different etching selectivity as the oxide layers 108.

Figure 1B:
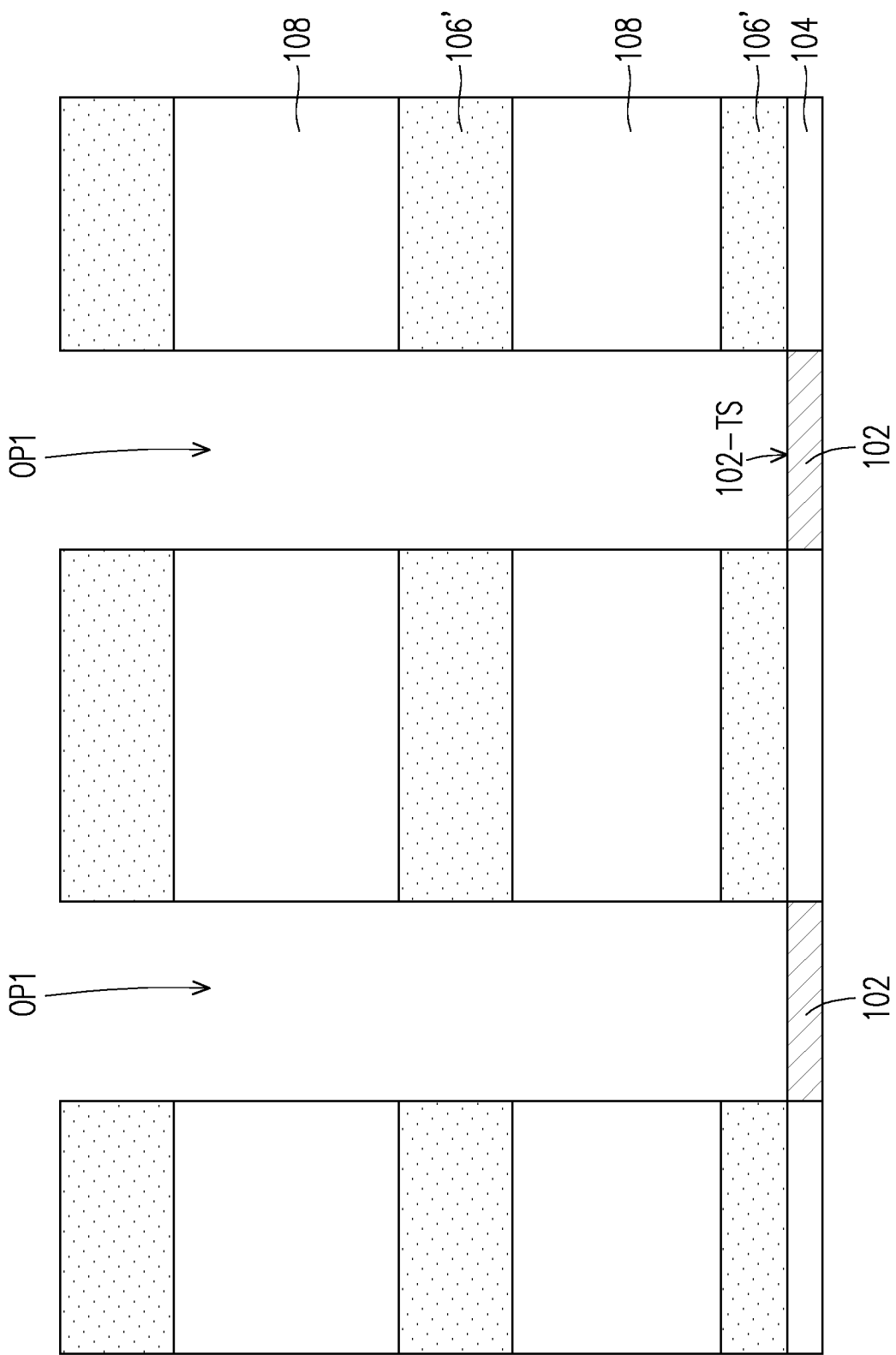

Referring to FIG. 1B, in a subsequent step, the supporting layers 106 and the oxide layers 108 are patterned to form a plurality of cylindrical openings OP1 (e.g. having a circular outline from a top view). For example, the cylindrical openings OP1 reveals a top surface 102-TS of the landing pads 102, and a hard mask pattern (not shown) may be formed over portions of the oxide layer 108, and over portions of the supporting layers 106. Thereafter, the oxide layers 108 and the supporting layers 106 not covered by the hard mask pattern may be removed using one or more acceptable etching processes to form the cylindrical openings OP1. Although only two cylindrical openings OP1 are illustrated herein, it should be noted that the number of cylindrical openings OP1 formed during the fabrication process is not limited thereto. For example, the number of cylindrical openings OP1 formed herein may correspond to the number of capacitors (cylindrical capacitors) formed in the semiconductor device, which may be adjusted based on product requirements. Furthermore, the supporting layers 106 are patterned to form a supporting structure 106' after the patterning process. The supporting structure 106' may be retained in subsequent etching steps to act as a support for the capacitor formed thereafter.

Figure 1C:
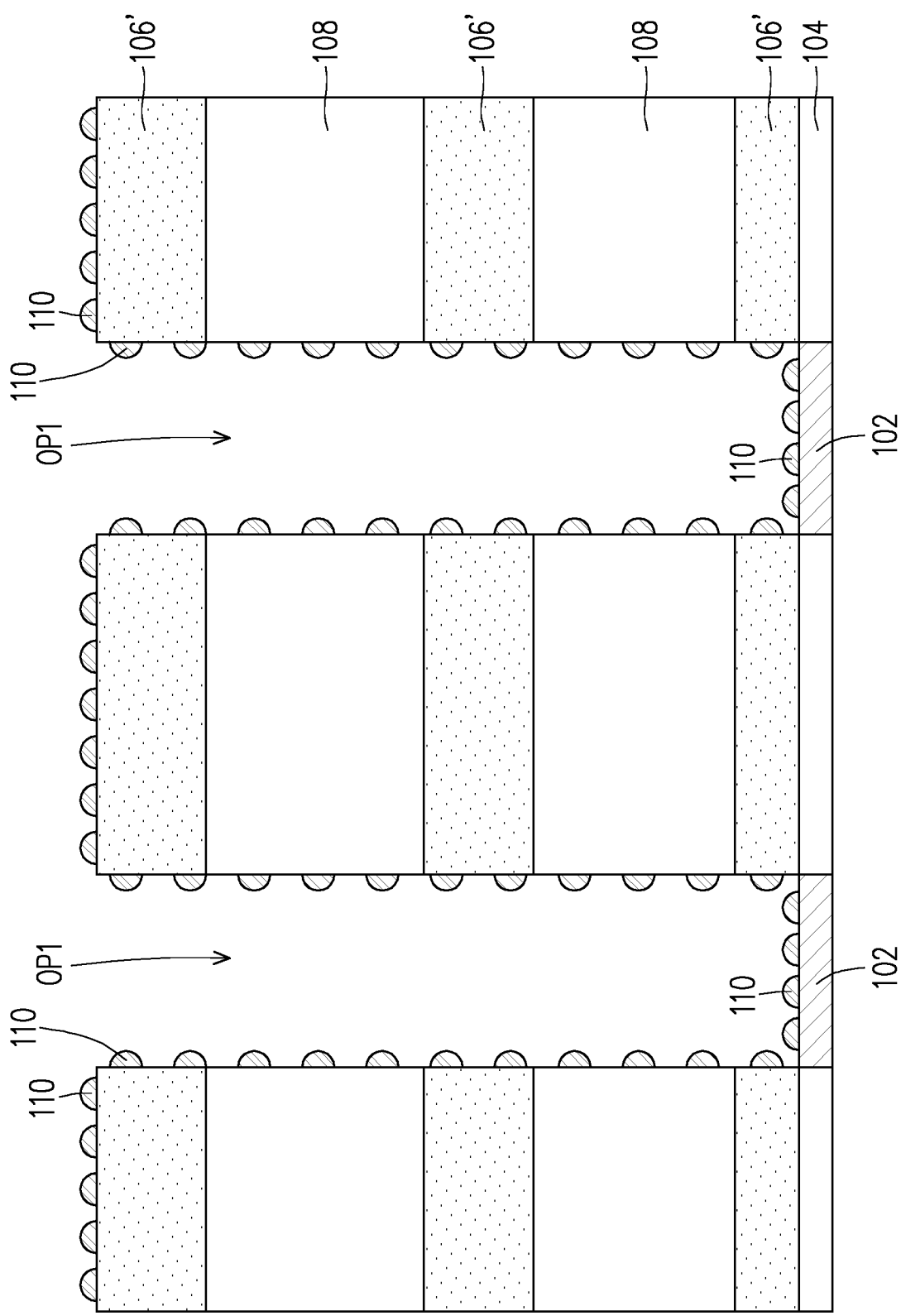

Referring to FIG. 1C, after forming the cylindrical openings OP1, a plurality of island structures 110 is formed over the supporting structure 106' and over the oxide layers 108. Furthermore, the island structures 110 are formed within the cylindrical openings OP1, on sidewalls of the cylindrical openings OP1 and on the landing pads 102. In order to form the island structures 110, a target time in chemical vapor deposition (CVD) and the number of cycles in atomic layer deposition (ALD) are controlled to be shorter than an incubation time, and smaller than the number of cycles that form a film layer. As such, a plurality of separated island structures 110 may be formed. The island structures 110 are made of titanium, and the island structures 110 may be oxidized in subsequent steps (e.g. during bottom electrode formation) to form titanium oxide.

Figure 1D:
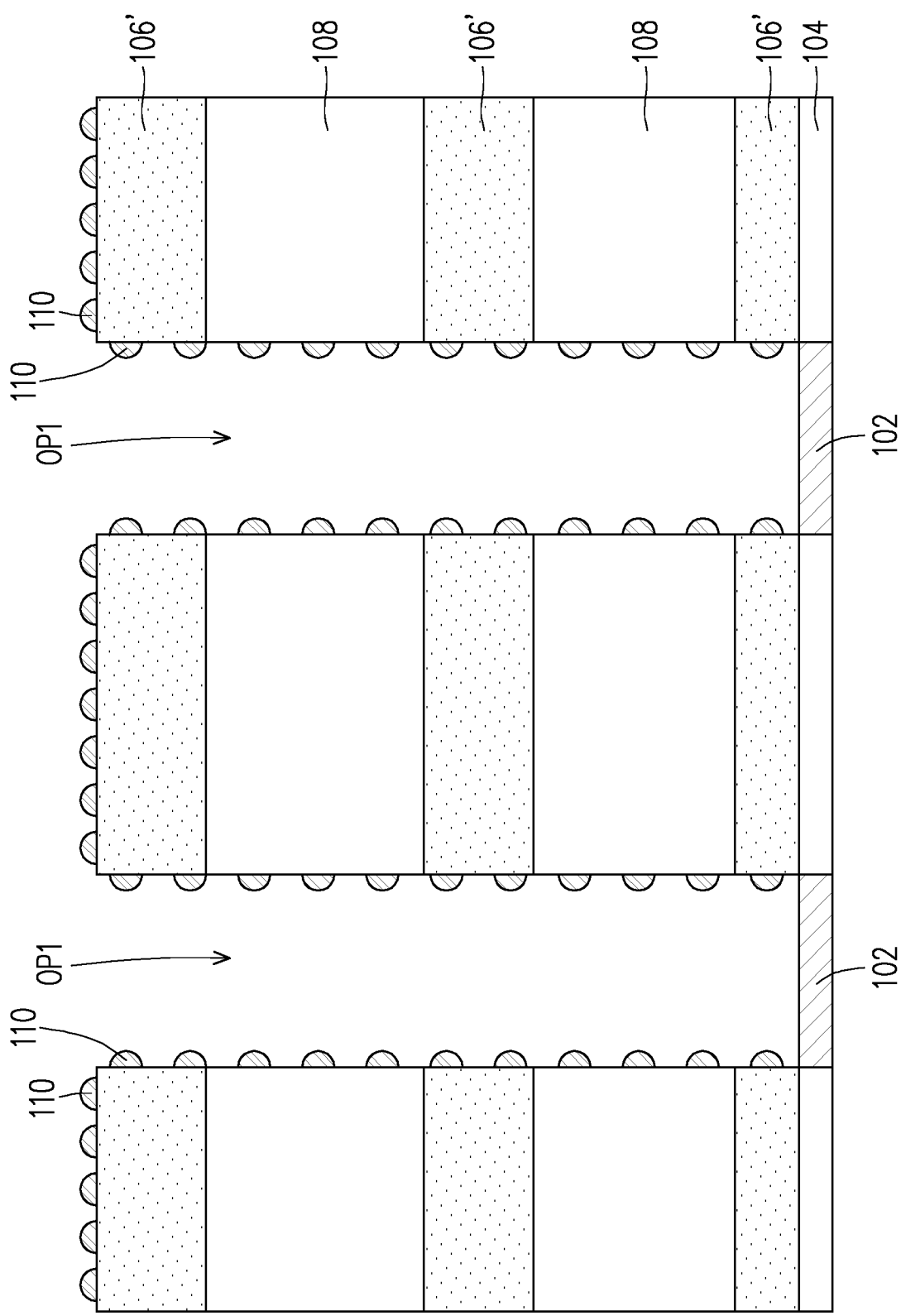

Referring to FIG. 1D, in a subsequent step, the island structures 110 located on the landing pads 102 are removed, while the island structures 110 located on the sidewalls of the cylindrical openings OP1 are retained. For example, the island structures 110 may be removed by suitable etching processes. It is desirable to remove the island structures 110 on the landing pads 102, as these island structures 110 may increase a resistance of the formed capacitor, and deteriorate the performance of the semiconductor device. As such, all of the island structures 110 contacting the landing pads 102 are suitably removed.

Figure 1E:
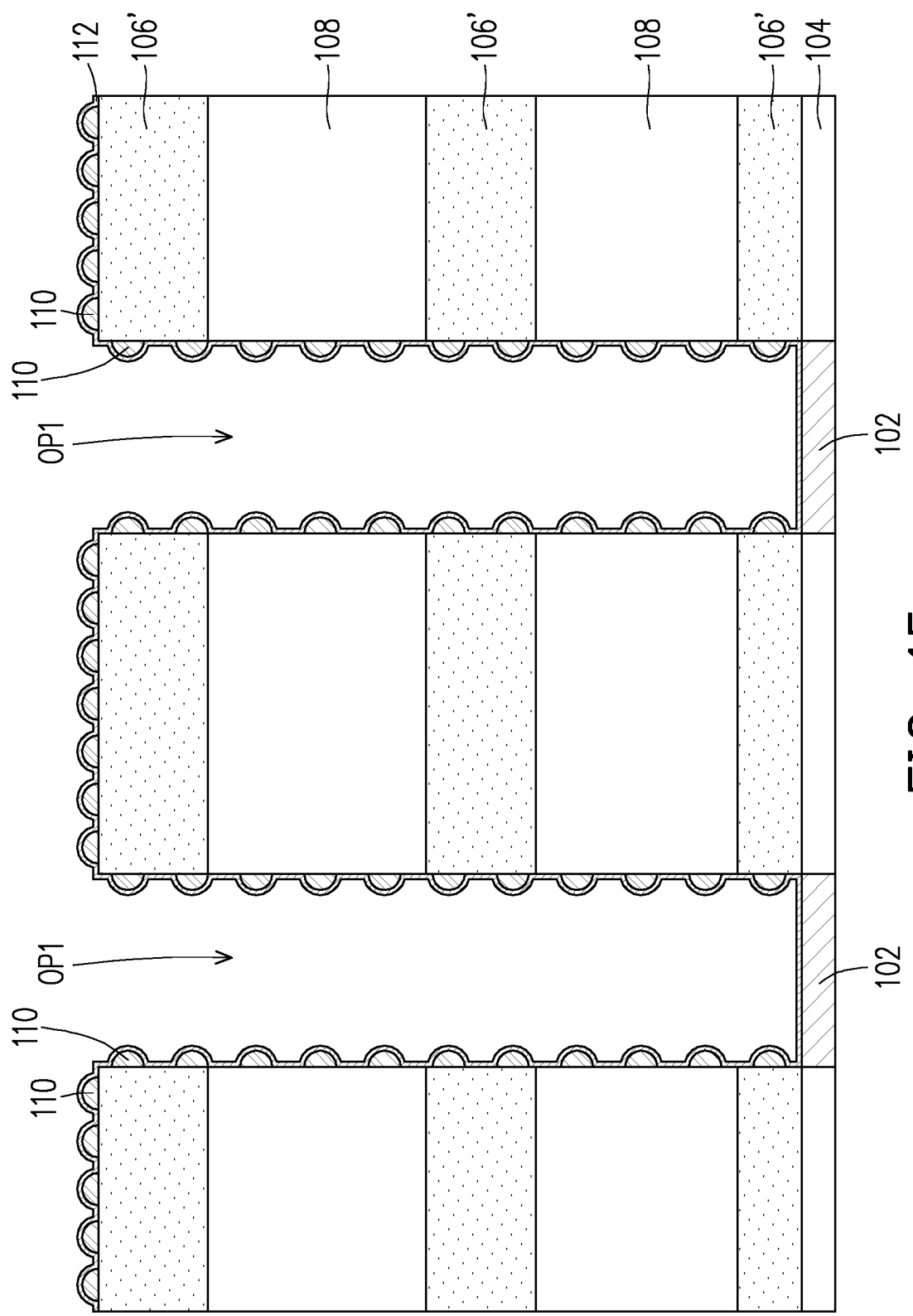

Referring to FIG. 1E, in a subsequent step, a conductive layer 112 is conformally formed over the island structures 110 and within the cylindrical openings OP1. The conductive layer 112 is covering and contacting the island structures 110, and covering and contacting the landing pads 102. The conductive layer 112 includes TiN, TaN, W, TiW, Al, Cu, silicide, Ru, or Pt.

Figure 1F:
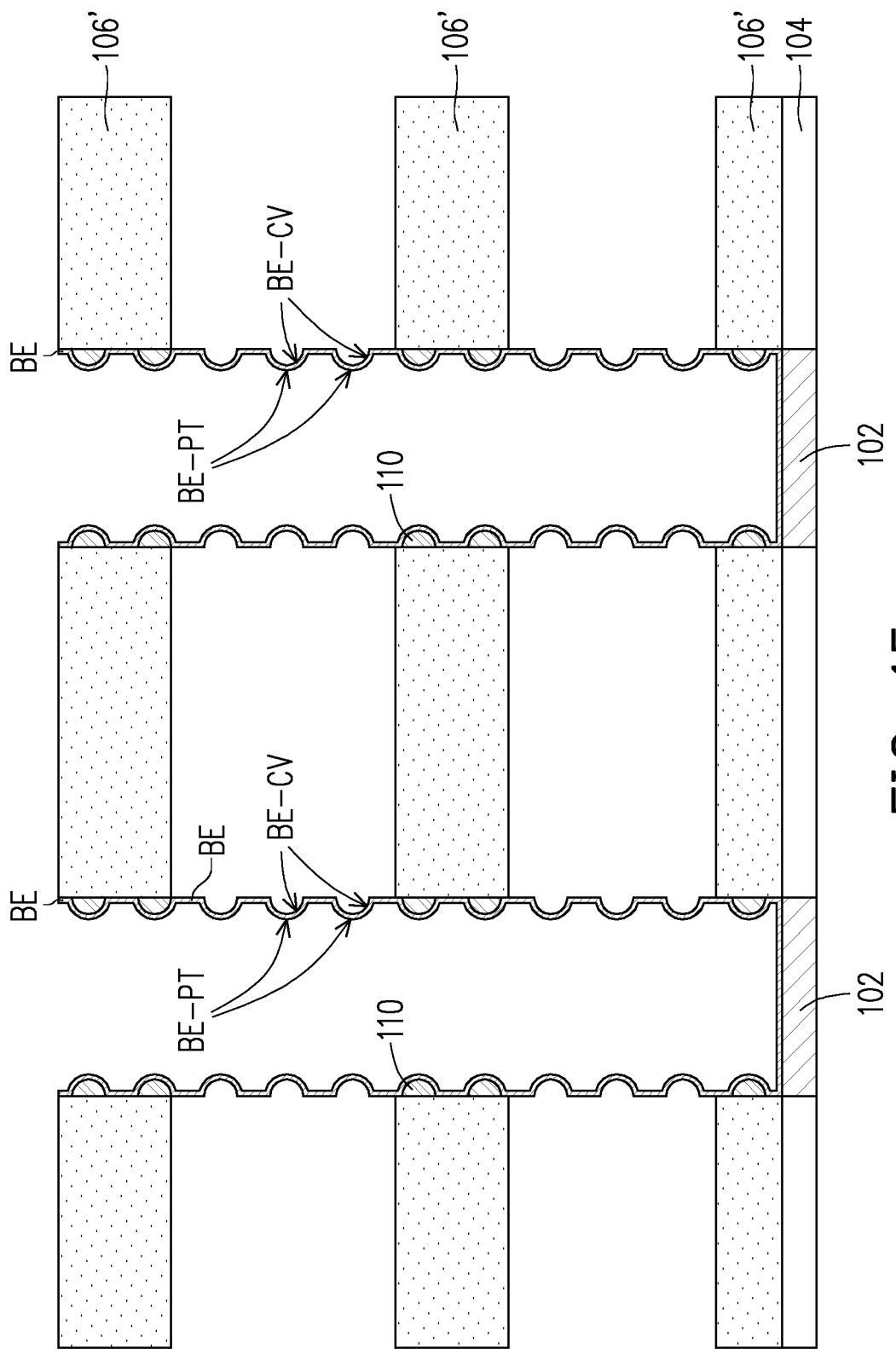

Referring to FIG. 1F, after forming the conductive layer 112, the conductive layer 112 is patterned to form a cylindrical bottom electrode BE, and the oxide layers 108 are stripped off while the island structures 110 (titanium oxide) on the oxide layers 108 are removed. In other word, when lithography and dry etching processes are performed to pattern the conductive layer 112, the oxide layers 108 along with the island structures 110 are removed and the supporting structures 106' along with the island structures 110 are still retained. Since the island structures 110 are oxidized to form titanium oxide, a single etching process may be performed to remove the oxide layers 108 along with the island structures 110.

As illustrated in FIG. 1F, the formed cylindrical bottom electrode BE is in contact with the landing pads 102, and is formed with a plurality of protruding portions BE-PT and a plurality of concaved portions BE-CV. The protruding portions BE-PT are located at an inner surface (e.g. protruding inwards) of the cylindrical bottom electrode BE, while the concaved portions BE-CV are located at an outer surface of the cylindrical bottom electrode BE. A position of the protruding portions BE-PT at the inner surface may correspond to the position of concaved portions BE-CV at the outer surface of the cylindrical bottom electrode BE. Furthermore, the plurality of protruding portions BE-PT is separated from one another, and the plurality of concaved portions BE-CV is separated from one another. For example, the cylindrical bottom electrode BE may include planar (non-protruding) portions that join the plurality of protruding portions BE-PT together, and join the plurality of concaved portions BE-CV together.

As further illustrated in FIG. 1F, after stripping off the oxide layers 108 and portions of the island structures 110, the supporting structure 106' is retained to support the cylindrical bottom electrode BE. For example, the supporting structure 106' is supporting the cylindrical bottom electrode BE from the outer surface of the cylindrical bottom electrode BE. The supporting structure 106' may include a first portion that supports a bottom section of the cylindrical bottom electrode BE, and include a second portion that supports a middle section of the cylindrical bottom electrode BE, and include a third portion that supports a top section of the cylindrical bottom electrode BE. Furthermore, the island structures 110 sandwiched between the supporting structure 106' and the outer surface of the cylindrical bottom electrode BE are retained after the lithography/etching processes.

Figure 1G:
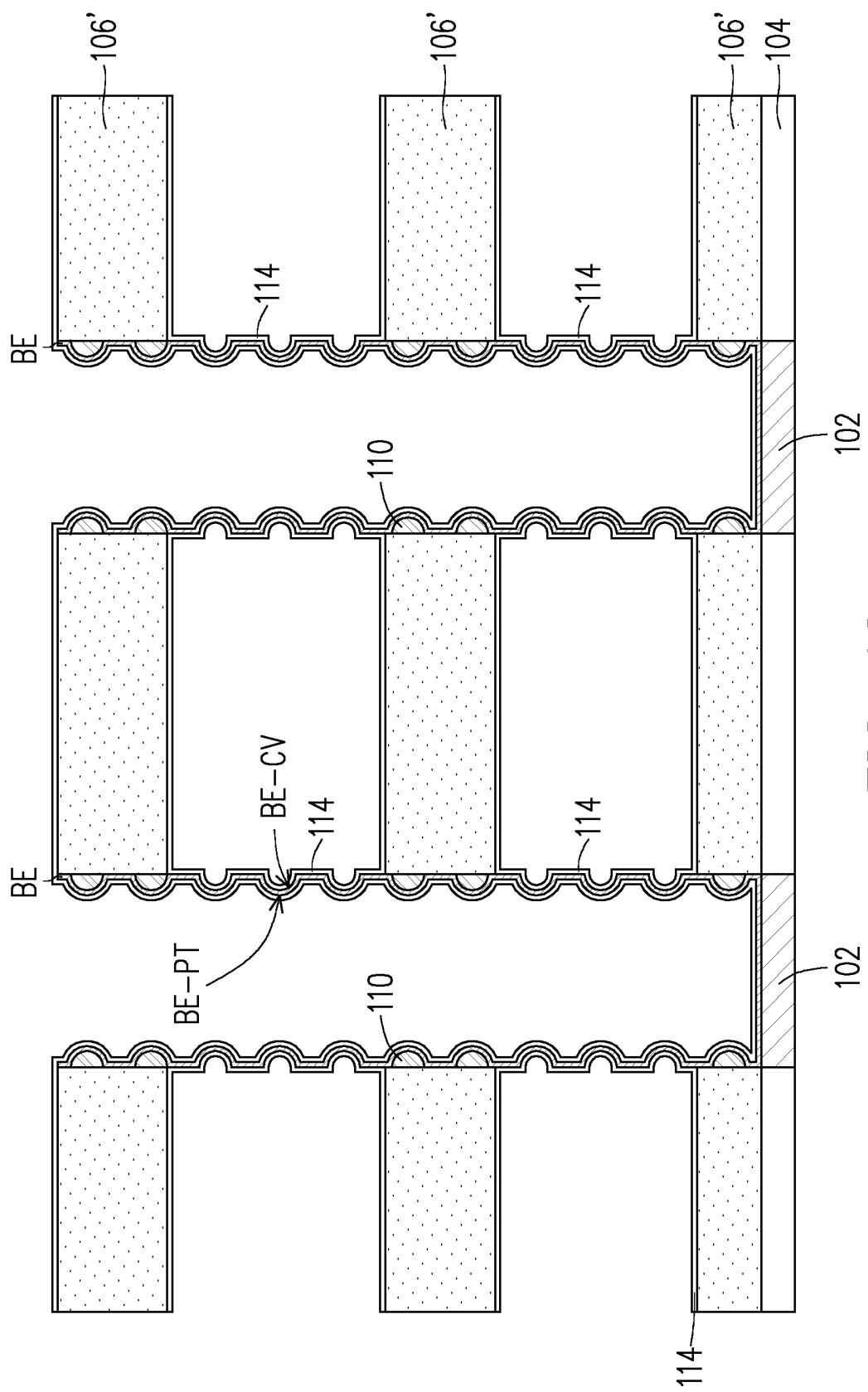

Referring to FIG. 1G, in a subsequent step, a dielectric layer 114 is conformally formed over the supporting structure 106', and conformally formed on the inner surface and the outer surface of the cylindrical bottom electrode BE. The dielectric layer 114 is covering the plurality of protruding portions BE-PT and the plurality of concaved portions BE-CV of the cylindrical bottom electrode BE. Since the dielectric layer 114 is conformally formed over the protruding portions BE-PT and the concaved portions BE-CV, the dielectric layer 114 may also include protruding parts and concaved parts (not labeled) at the corresponding position. In some embodiments, the dielectric layer 114 is a high-k material layer, and the material thereof is, for instance, oxide of the following elements, such as: hafnium, zirconium, aluminum, silicon, titanium, lanthanum, yttrium, gadolinium, tantalum, aluminum nitride, or combinations thereof.

Figure 1H:
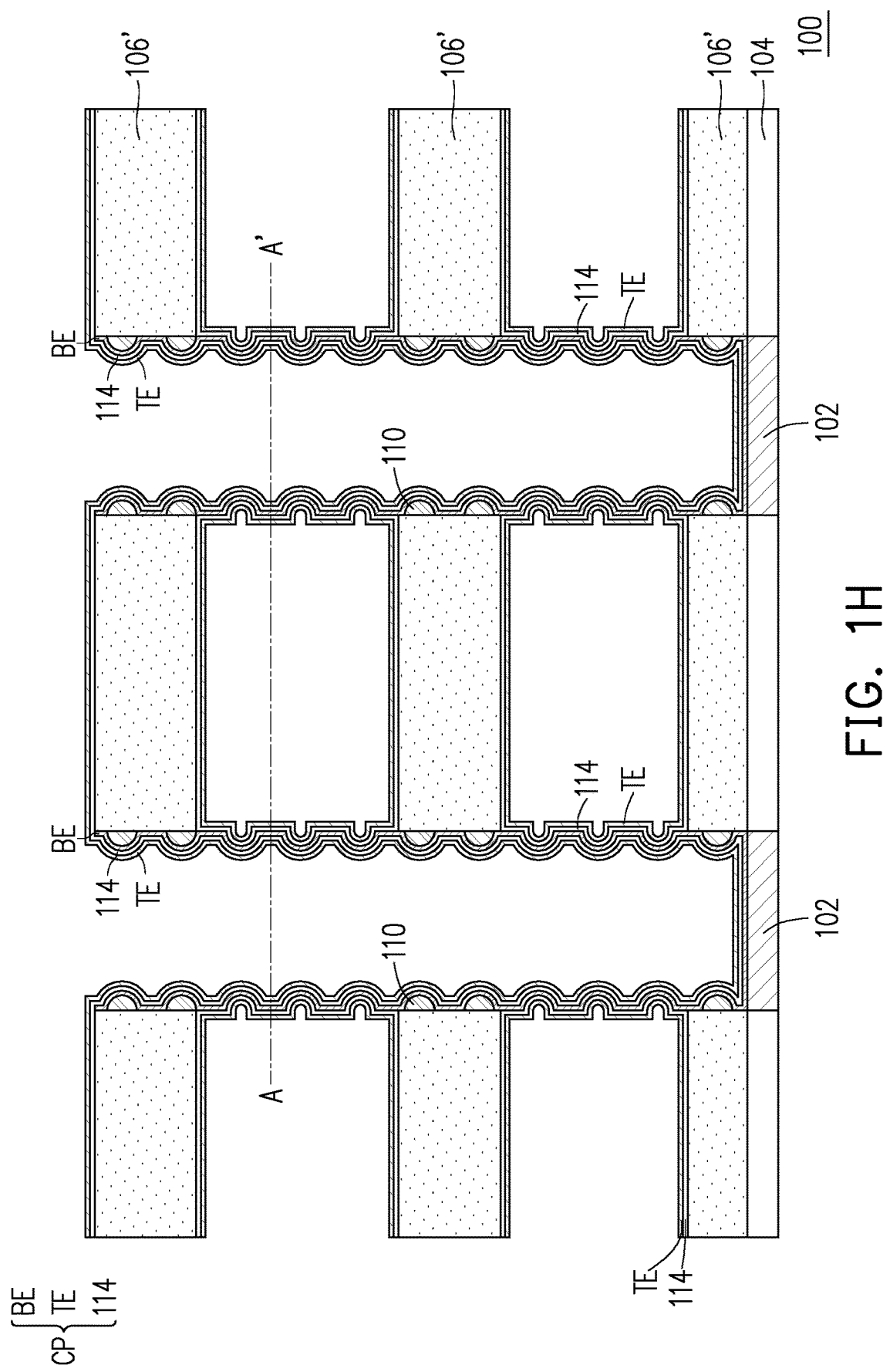

Referring to FIG. 1H, after forming the dielectric layer 114, a top electrode TE is conformally formed over the supporting structure 106', and conformally formed on the dielectric layer 114 over the inner surface and the outer surface of the cylindrical bottom electrode BE. Since the top electrode TE is conformally formed over the dielectric layer 14, it may also include protruding parts and concaved parts (not labeled) at positions corresponding to the protruding portions BE-PT and the concaved portions BE-CV. The top electrode TE includes TiN, TaN, W, TiW, Al, Cu, silicide, Ru, or Pt, for example. Up to here, a semiconductor device 100 according to a first embodiment of the present disclosure is accomplished. In the present embodiment, the top electrode TE, the dielectric layer 114 and the cylindrical bottom electrode BE together constitute a capacitor CP of the semiconductor device 100.

Figure 1I:
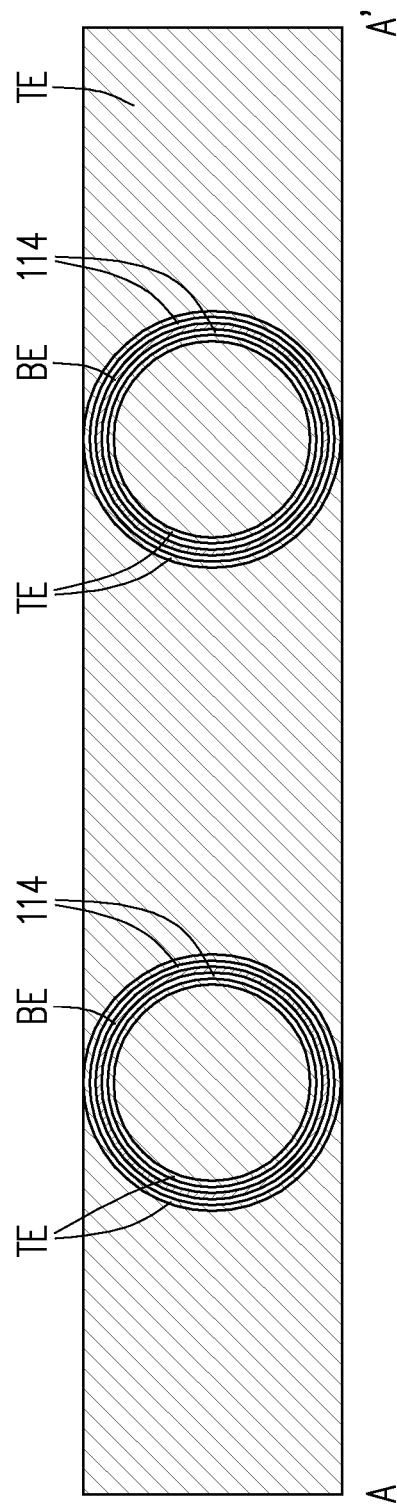

FIG. 1I is a top view of the semiconductor device 100 illustrated in FIG. 1H taken alone the sectional line A-A'. As illustrated in FIG. 1H and FIG. 1I, the dielectric layer 114 and the top electrode TE are formed on the inner surface and outer surface of the cylindrical bottom electrode BE to surround the cylindrical bottom electrode BE. Since the cylindrical bottom electrode BE is formed with protruding portions BE-PT and concaved portions BE-CV, and the dielectric layer 114 and top electrode TE are conformally formed over the inner and outer surfaces of the cylindrical bottom electrode BE, the formed capacitor CP (MIM structure) may have a significantly increased surface area. As such, a capacitance of the capacitor CP in the semiconductor device 100 may be significantly increased, and the refresh performance of the semiconductor device 100 (e.g. DRAM device) may be improved.

FIG. 2A to FIG. 2H are schematic sectional and top views in a method of fabricating a semiconductor device in accordance with a second embodiment of the present disclosure. The method illustrated in FIG. 2A to FIG. 2H is similar to the method illustrated in FIG. 1A to FIG. 1I. Therefore, the same reference numerals are used to refer to the same or like parts, and its detailed descriptions are omitted herein.

Figure 2A:
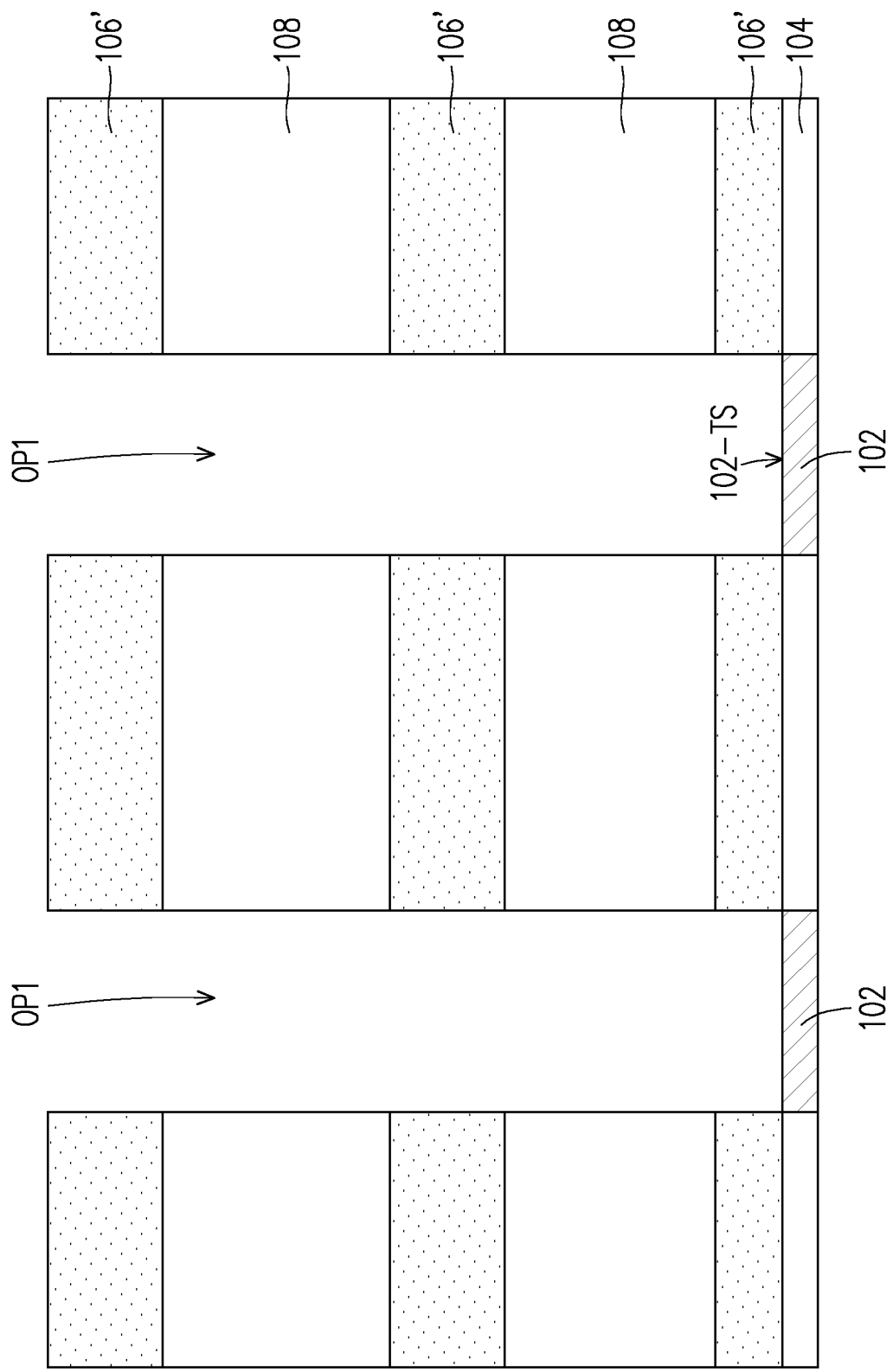

Referring to FIG. 2A, the same steps described in FIG. 1A to FIG. 1B may be performed to form a supporting structure 106' and oxide layers 108 over the dielectric layer 104. Supporting layers 106 may be patterned to form the supporting structure 106'. Furthermore, a plurality of cylindrical openings OP1 (e.g. having a circular outline from a top view) is formed by patterning the supporting layers 106 and the oxide layers 108.

Figure 2B:
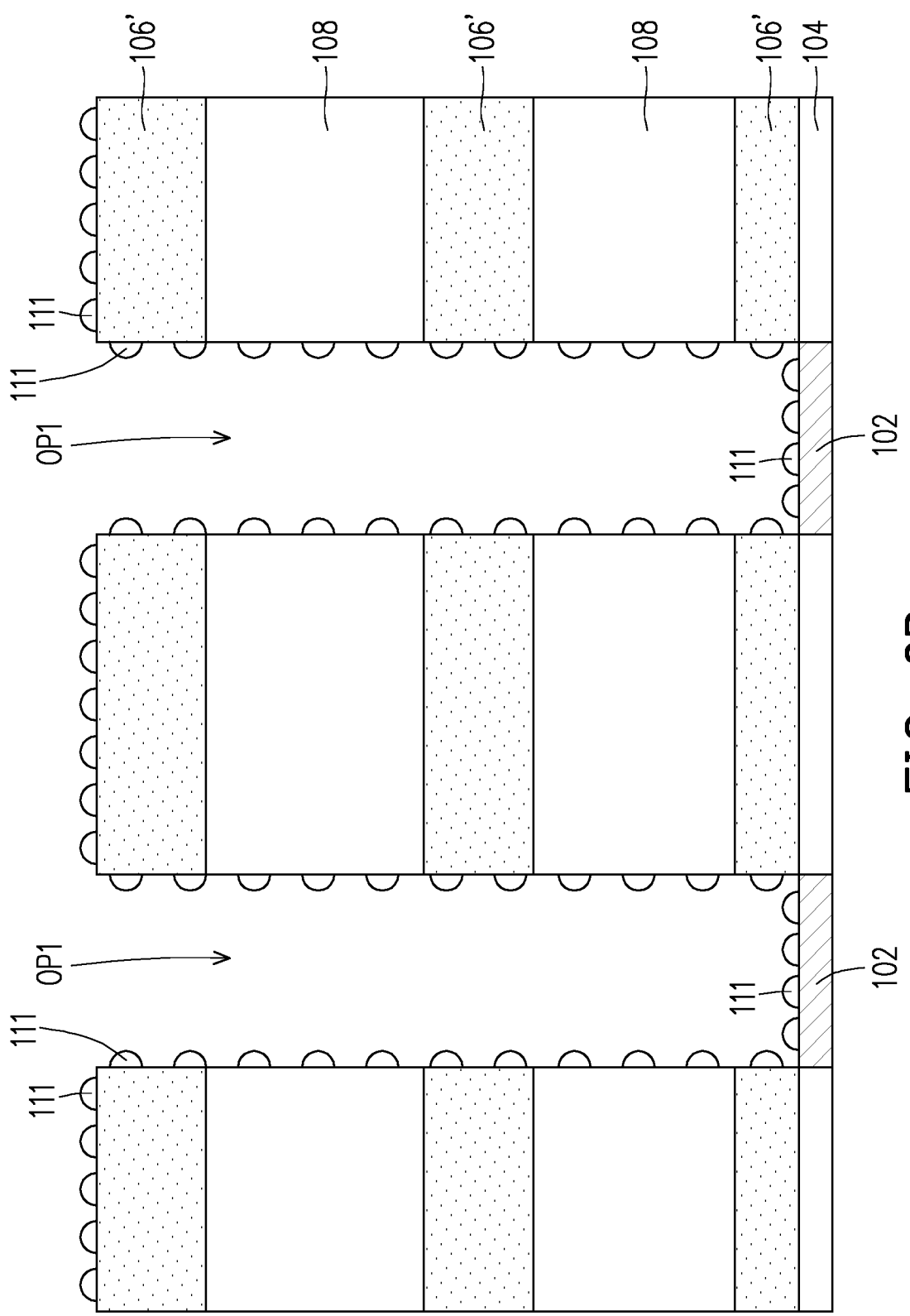

Referring to FIG. 2B, in a subsequent step, a plurality of island structures 111 is formed over the supporting structure 106' and over the oxide layers 108. The island structures 111 are formed within the cylindrical openings OP1, on sidewalls of the cylindrical openings OP1 and on the landing pads 102. In order to form the island structures 111, a target time in CVD and the number of cycles in ALD are controlled to be shorter than an incubation time, and smaller than the number of cycles that form a film layer. As such, a plurality of separated island structures 111 may be formed. In the exemplary embodiment, the island structures 111 are made of silicon oxide, for example.

Figure 2C:
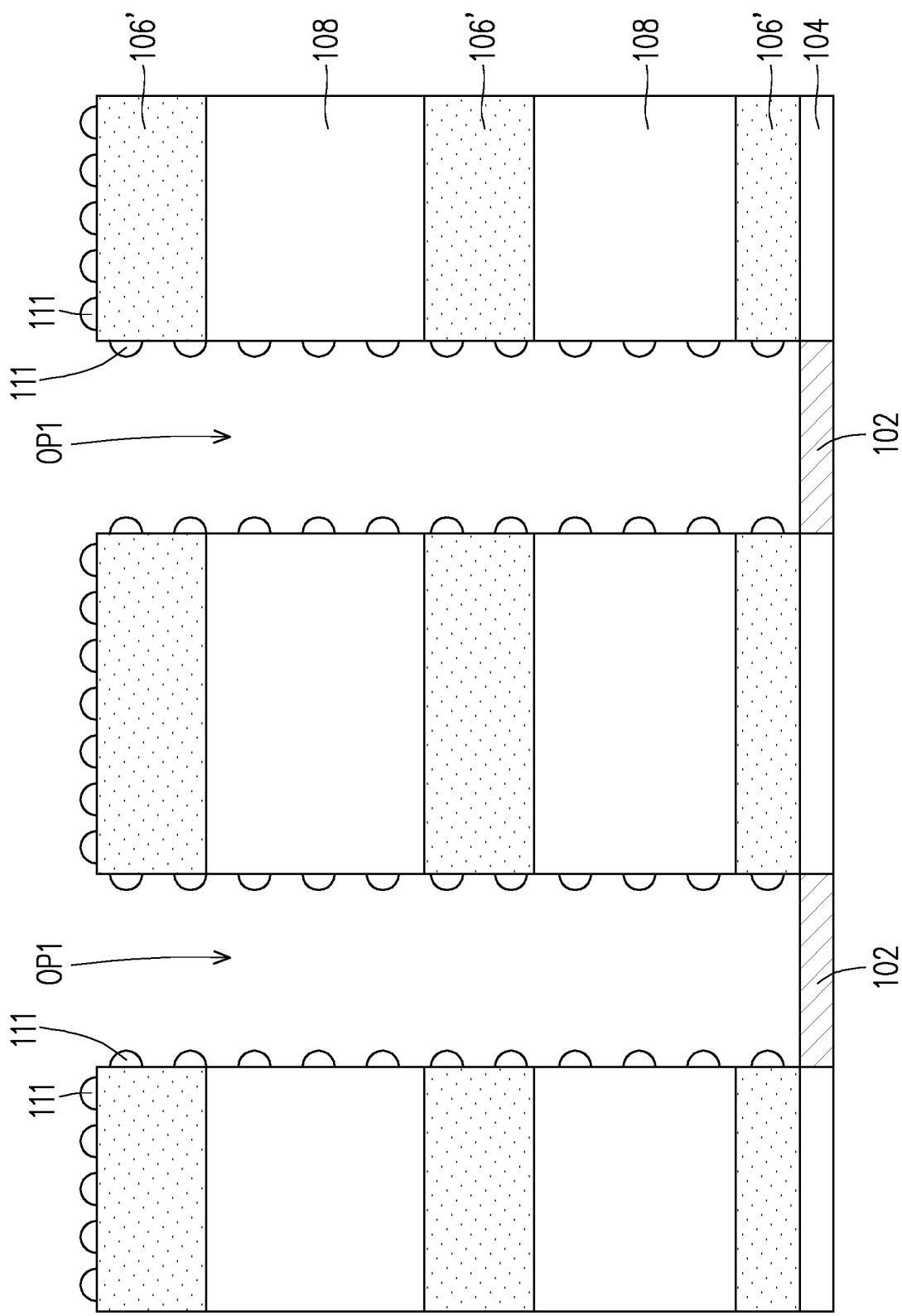
Figure 2D:
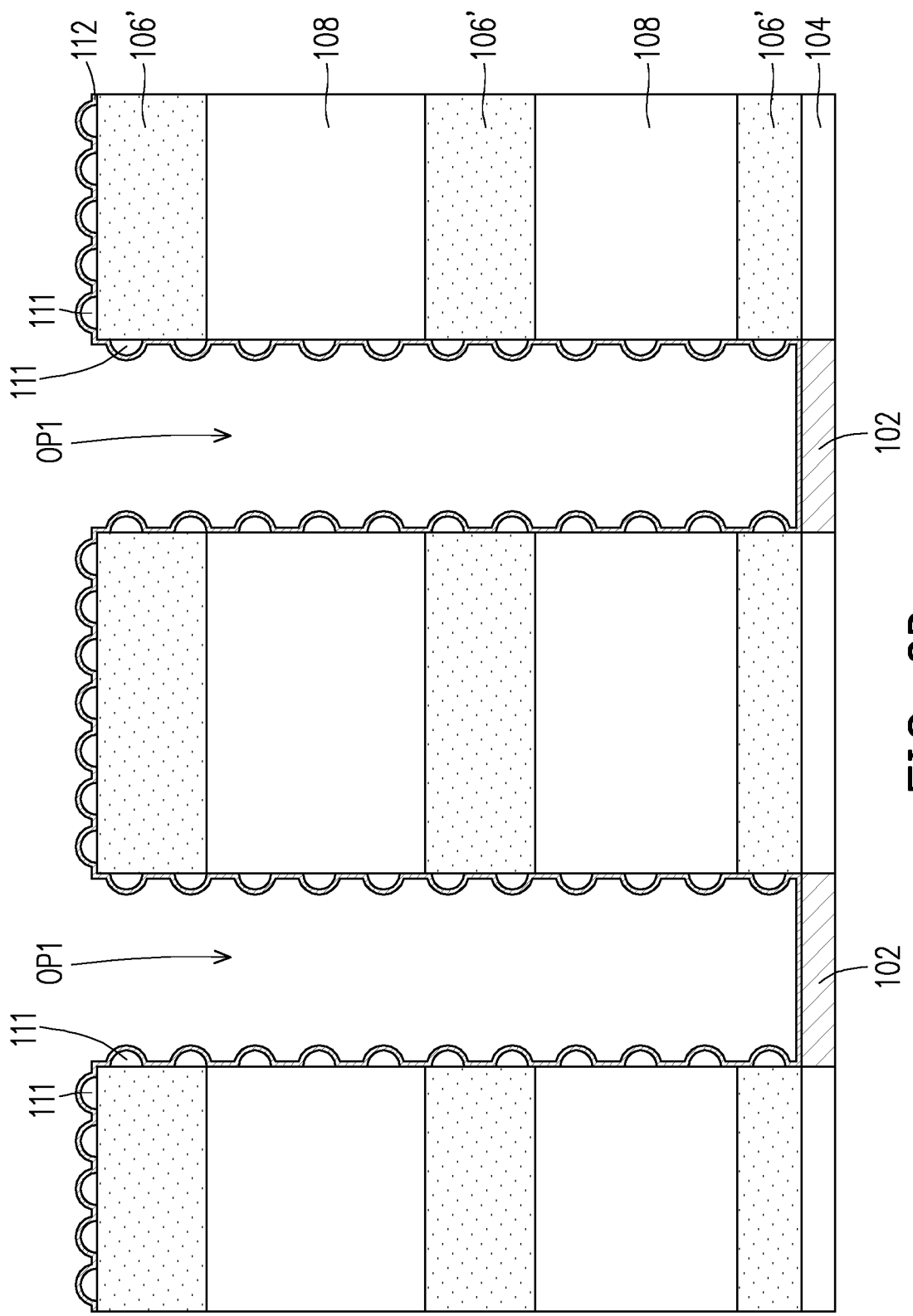

Referring to FIG. 2C, in a subsequent step, the island structures 111 located on the landing pads 102 are removed, while the island structures 111 located on the sidewalls of the cylindrical openings OP1 are retained. Subsequently, as illustrated in FIG. 2D, a conductive layer 112 is conformally formed over the island structures 111 and within the cylindrical openings OP1. For example, the conductive layer 112 is covering and contacting the island structures 111, and covering and contacting the landing pads 102.

Figure 2E:
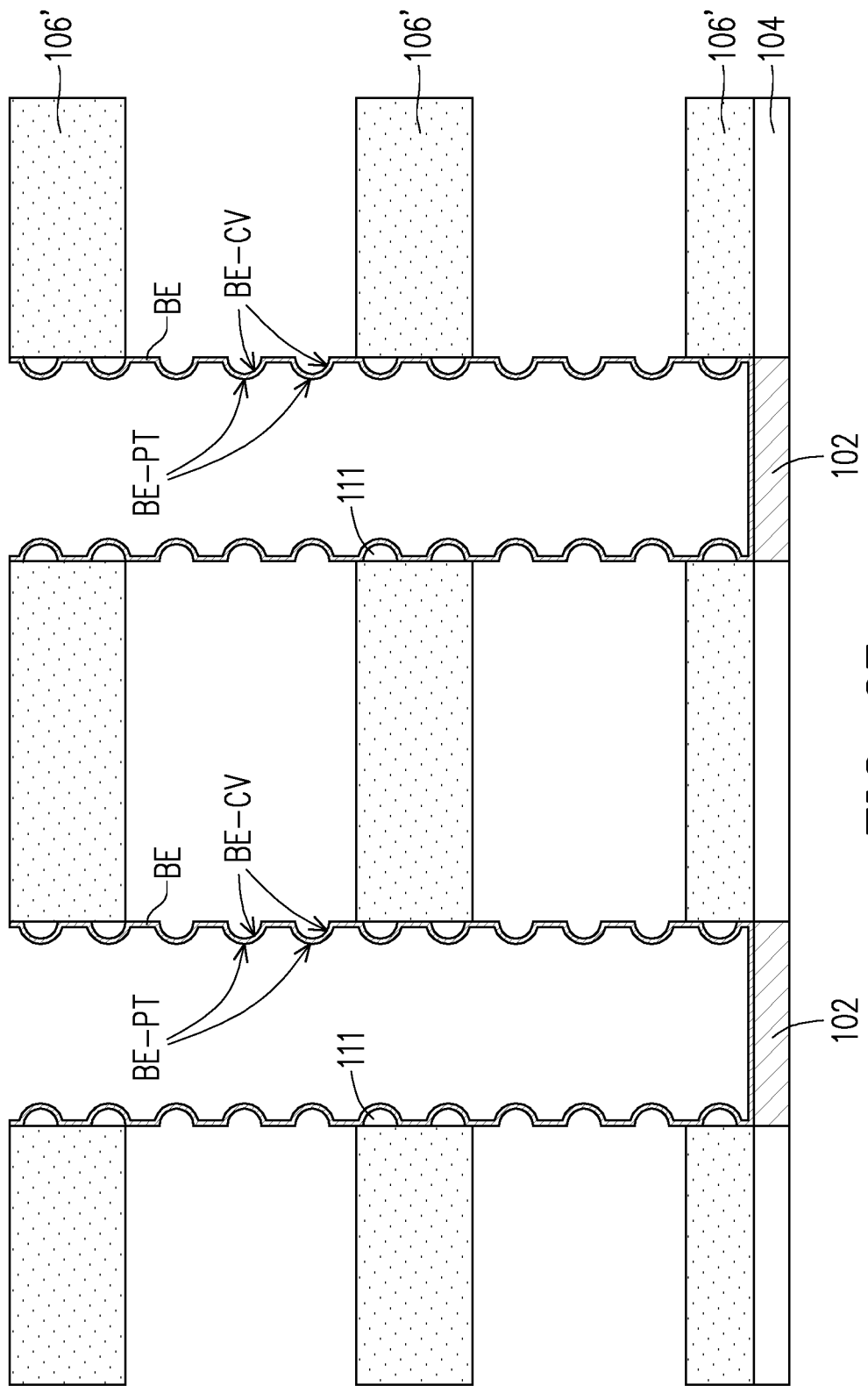

Referring to FIG. 2E, after forming the conductive layer 112, the conductive layer 112 is patterned to form a cylindrical bottom electrode BE, and the oxide layers 108 are stripped off while the island structures 111 (silicon oxide) on the oxide layers 108 are removed, since the island structures 111 are formed of silicon oxide, a single etching process may be performed to remove the oxide layers 108 along with the island structures 111. It is noted that other type of oxides (not limited to silicon oxide or titanium oxide) may be used as the island structures (110/111), so that they can be suitably removed along with the oxide layers 108.

As illustrated in FIG. 2E, similar to previous embodiments, the formed cylindrical bottom electrode BE is in contact with the landing pads 102, and is formed with a plurality of protruding portions BE-PT and a plurality of concaved portions BE-CV. The island structures 111 sandwiched between the supporting structure 106' and the outer surface of the cylindrical bottom electrode BE are retained after the lithography/etching processes.

Figure 2F:
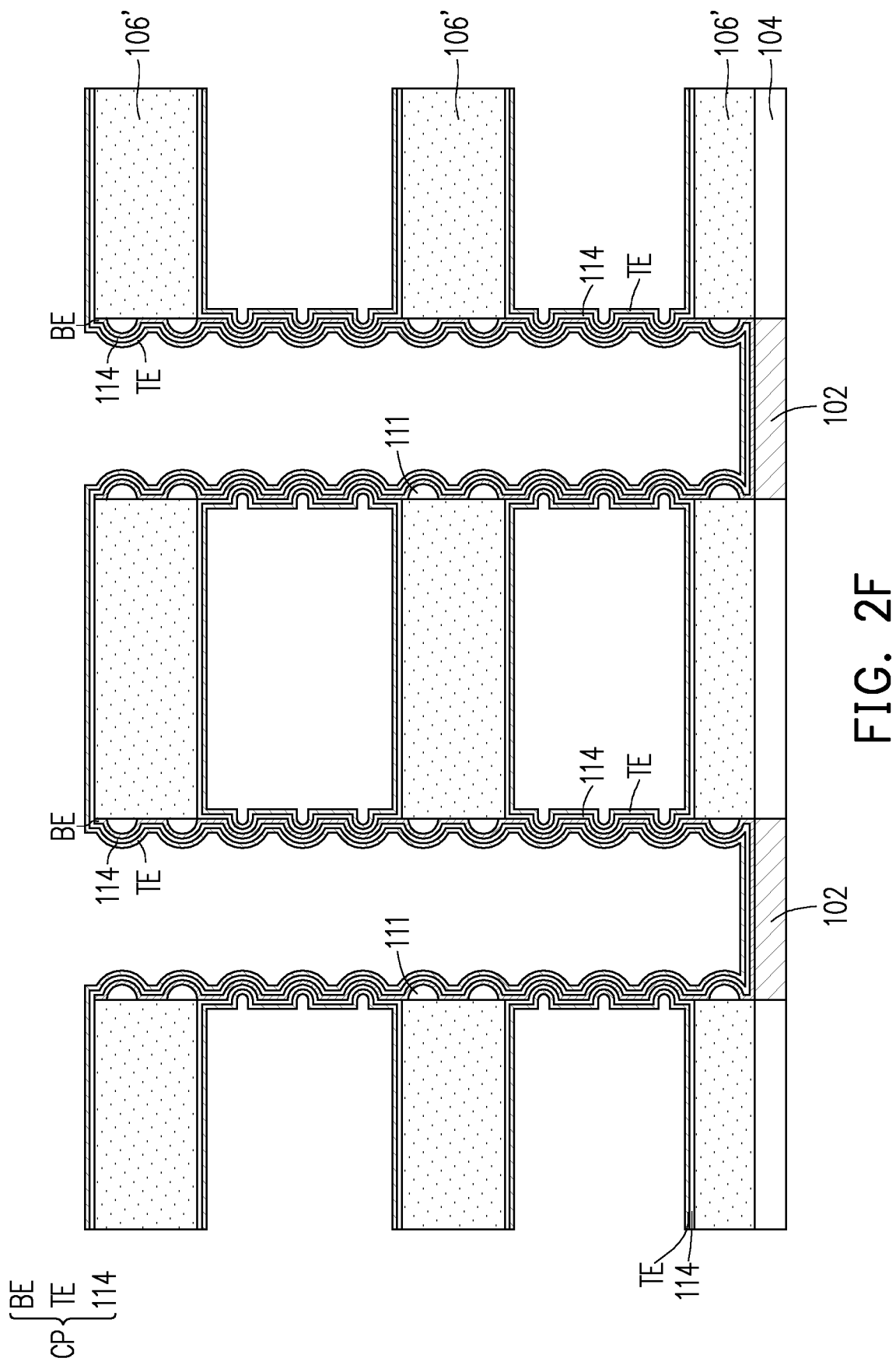
Figure 2G:
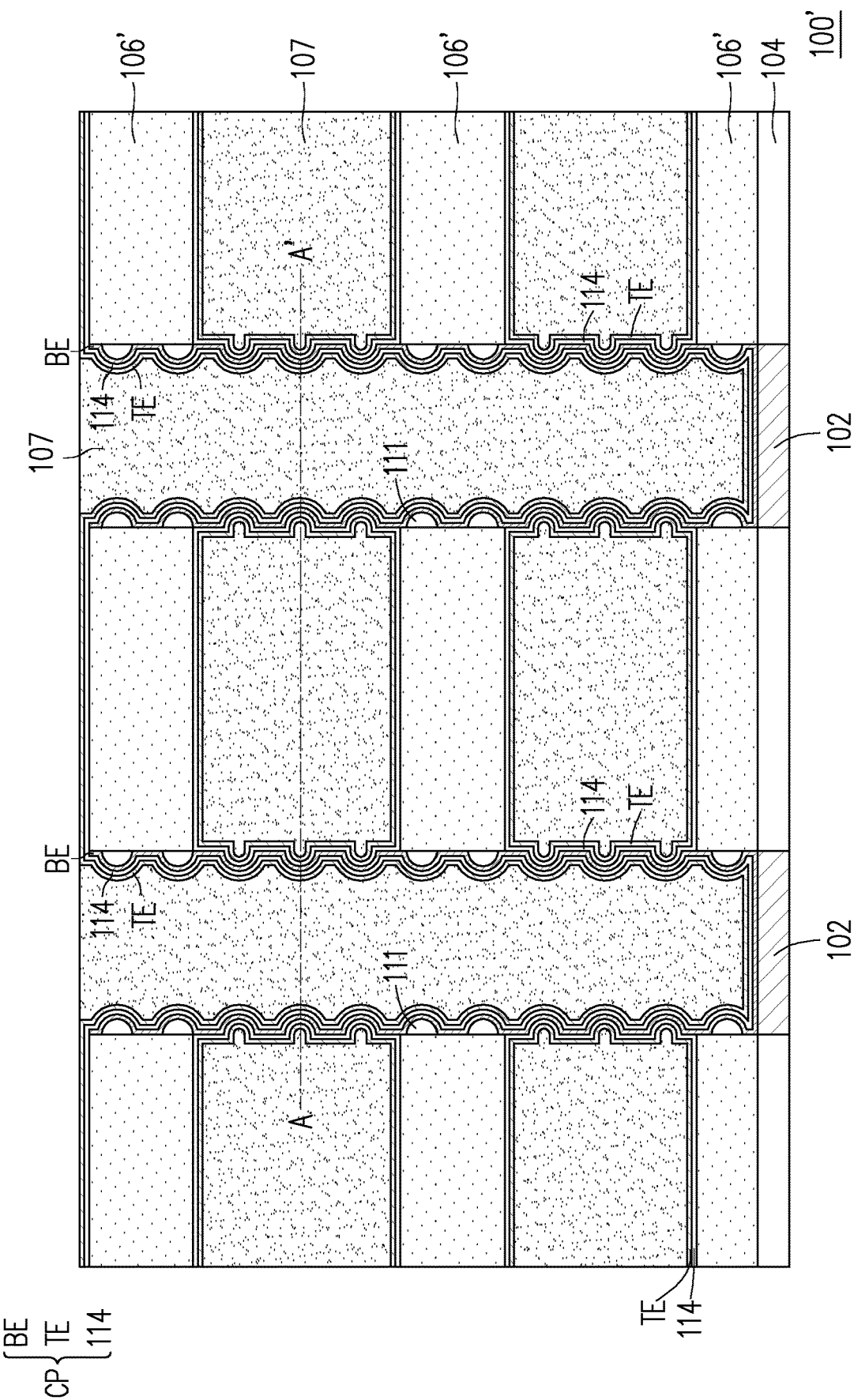
Figure 2H:
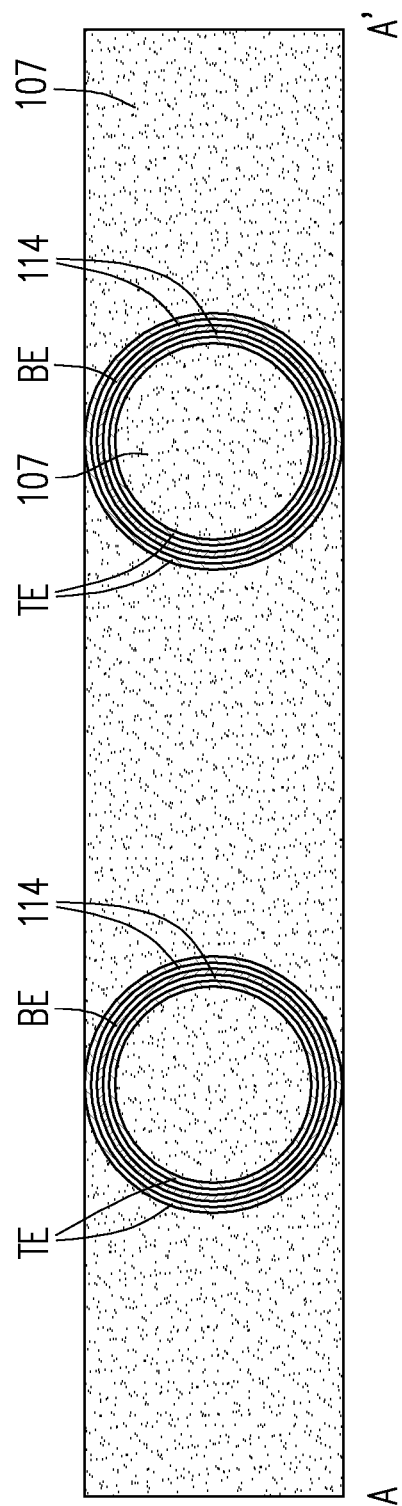

Referring to FIG. 2F, the same steps illustrated in FIG. 1G and FIG. 1H may be performed to form a dielectric layer 114 and a top electrode TE conformally over the cylindrical bottom electrode BE. The top electrode TE, the dielectric layer 114 and the cylindrical bottom electrode BE together constitute a capacitor CP. Referring to FIG. 2G, conductive layers 107 such as SiGe and/or tungsten (W) may be used to fill up the gaps between the capacitor CP and the supporting structure 106'. Up to here, a semiconductor device 100' according to a second embodiment of the present disclosure is accomplished, FIG. 2H is a top view of the semiconductor device 100' illustrated in FIG. 2G taken alone the sectional line A-A'. As illustrated in FIG. 2G and FIG. 2H, similar to the previous embodiments, the dielectric layer 114 and the top electrode TE are formed on the inner surface and outer surface of the cylindrical bottom electrode BE to surround the cylindrical bottom electrode BE. Since the cylindrical bottom electrode BE is formed with protruding portions BE-PT and concaved portions BE-CV, and the dielectric layer 114 and top electrode TE are conformally formed over the inner and outer surfaces of the cylindrical bottom electrode BE, the formed capacitor CP (MIM structure) may have a significantly increased surface area. As such, a capacitance of the capacitor CP in the semiconductor device 100' may be significantly increased, and the refresh performance of the semiconductor device 100' (e.g. DRAM device) may be improved.

FIG. 3A to FIG. 3E are schematic sectional and top views in a method of fabricating a semiconductor device in accordance with a third embodiment of the present disclosure. The method illustrated in FIG. 3A to FIG. 3E is similar to the method illustrated in FIG. 1A to FIG. 1I. Therefore, the same reference numerals are used to refer to the same or like parts, and its detailed descriptions are omitted herein.

Figure 3A:
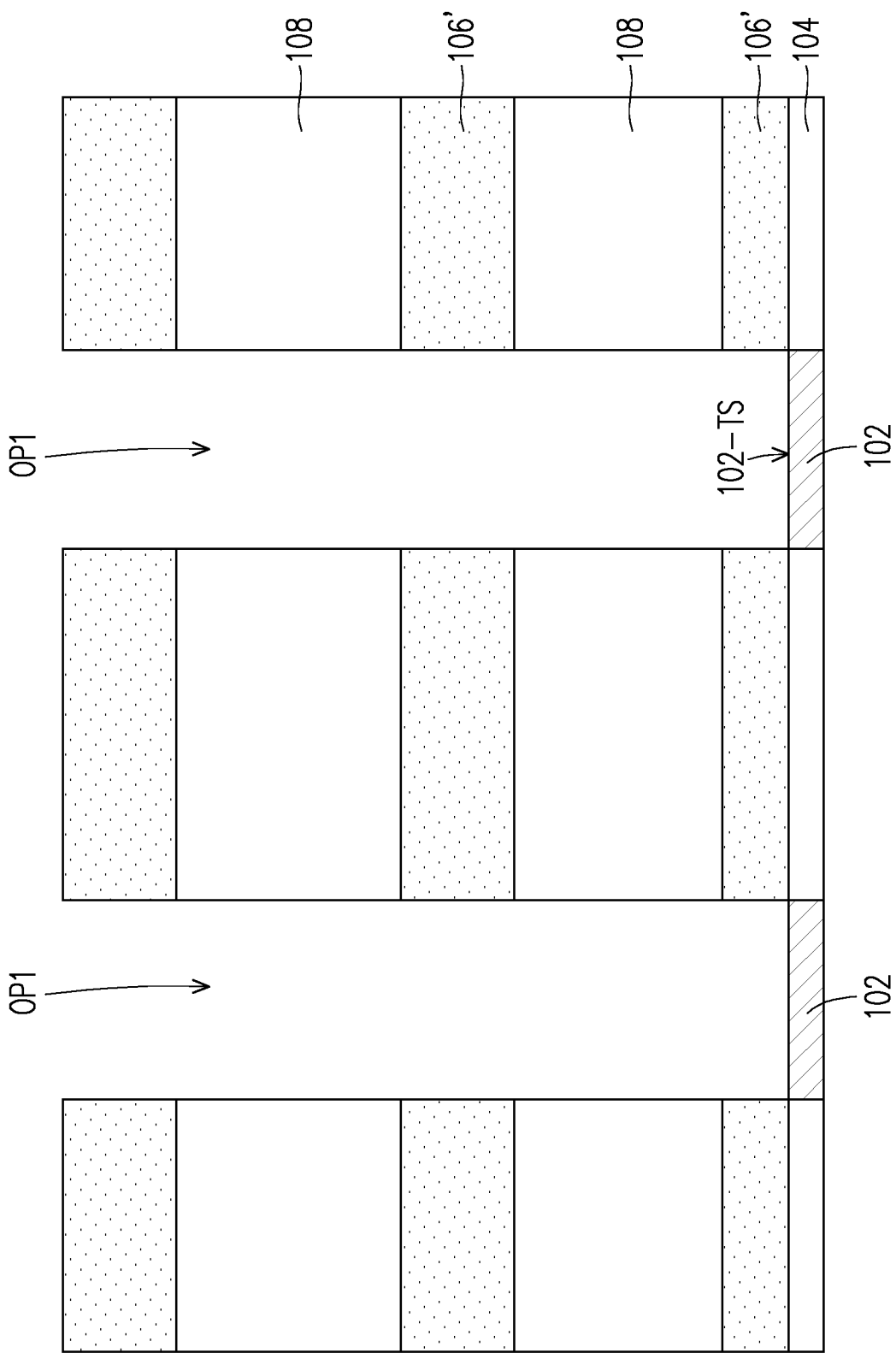

Referring to FIG. 3A, the same steps described in FIG. 1A to FIG. 1B may be performed to form a supporting structure 106' and oxide layers 108 over the dielectric layer 104. Supporting layers 106 may be patterned to form the supporting structure 106', and a plurality of cylindrical openings OP1 (e.g. having a circular outline from a top view) is formed in the supporting structure 106' and the oxide layers 108.

Figure 3B:
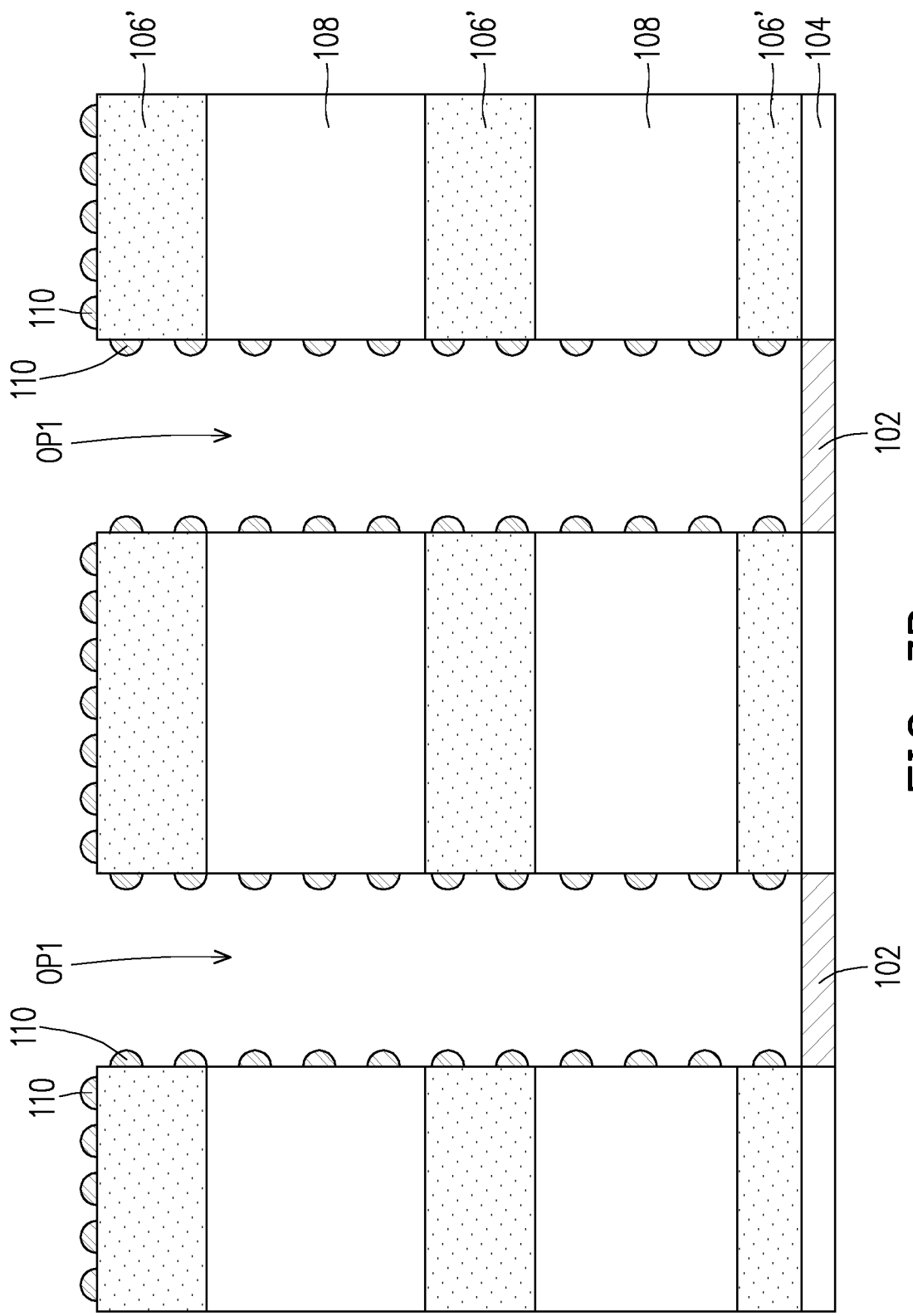

Referring to FIG. 3B, in a subsequent step, a plurality of island structures 110 is formed over the supporting structure 106' and over the oxide layers 108. Furthermore, the island structures 110 are selectively formed within the cylindrical openings OP1, on sidewalls of the cylindrical openings OP1, while not being formed on the landing pads 102. In other words, an area selective deposition (ASD) is performed to form the island structures 110 in selected areas. As such, the need to remove the island structures 110 from the landing pads 102 is omitted.

In the exemplary embodiment, the island structures 110 are formed by atomic layer deposition (ALD) with area selective deposition. In order to form the island structures 110, the number of cycles in ALD are controlled to be smaller than the number of cycles that form a film layer. As such, a plurality of separated island structures 110 may be formed, and the island structures 110 are made of titanium oxide, for example. However, it is noted that the same area selective deposition technique may be applied to island structures of other materials (e.g. island structures 111 made of silicon oxide).

Figure 3C:
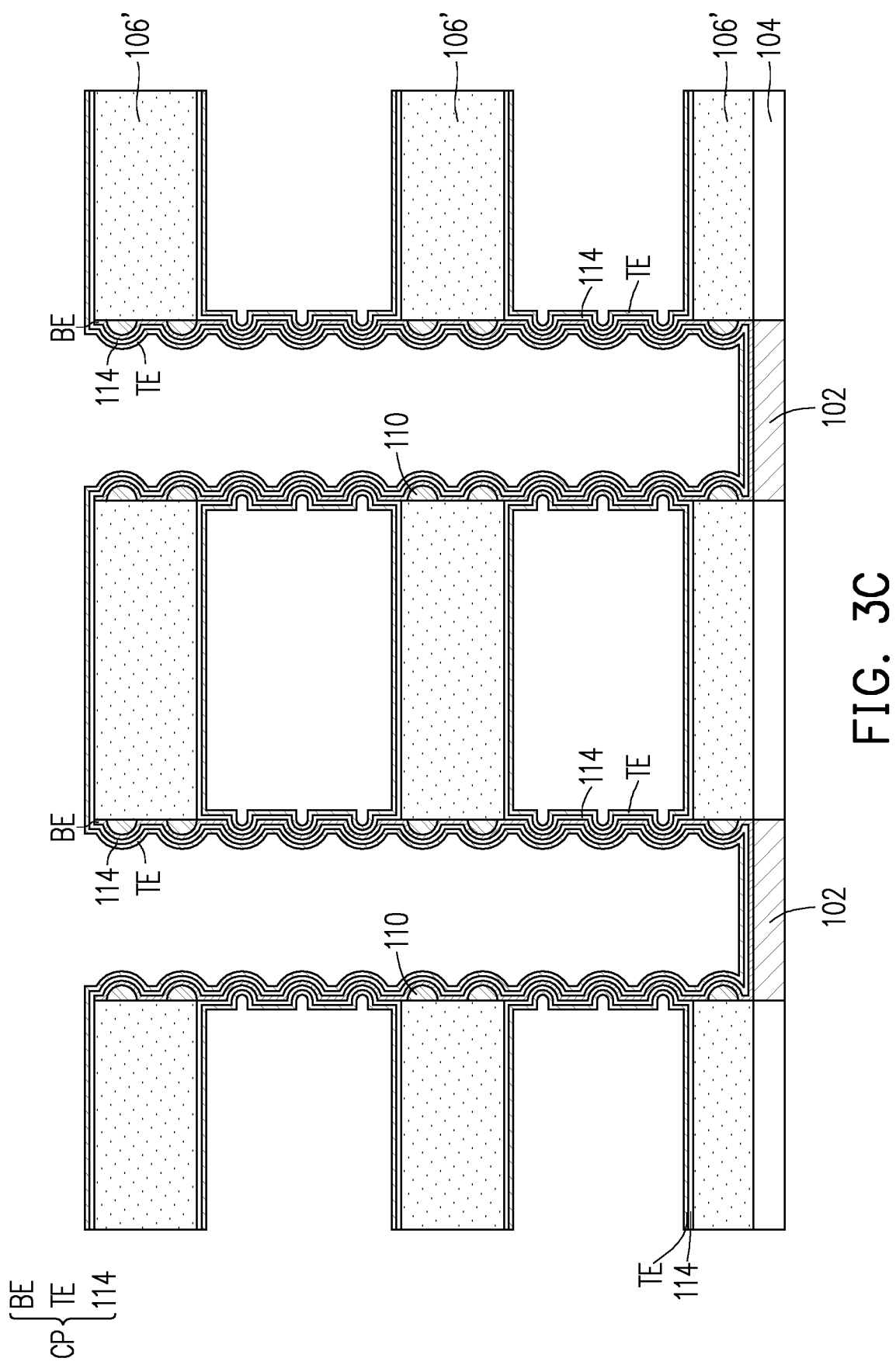
Figure 3D:
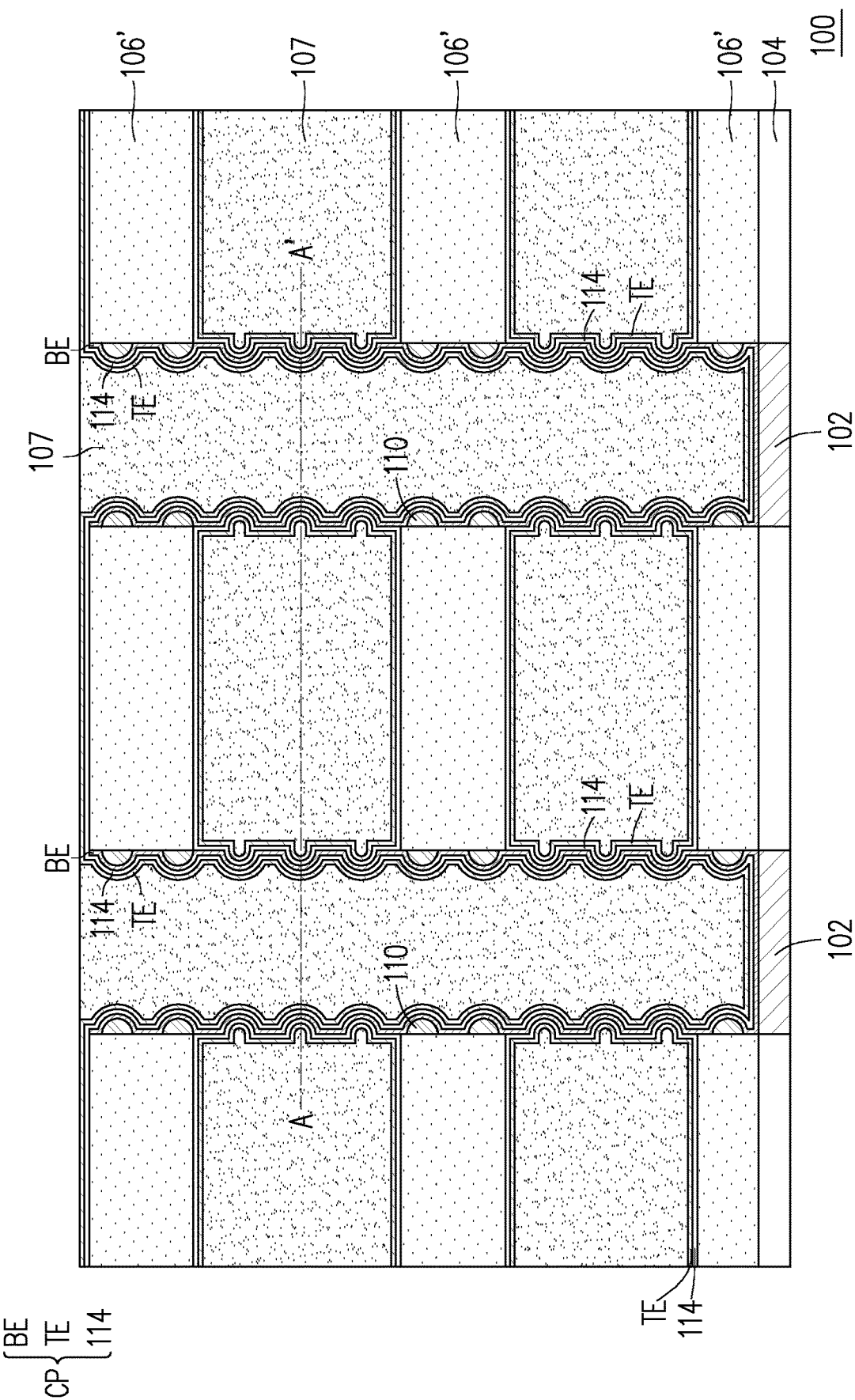
Figure 3E:
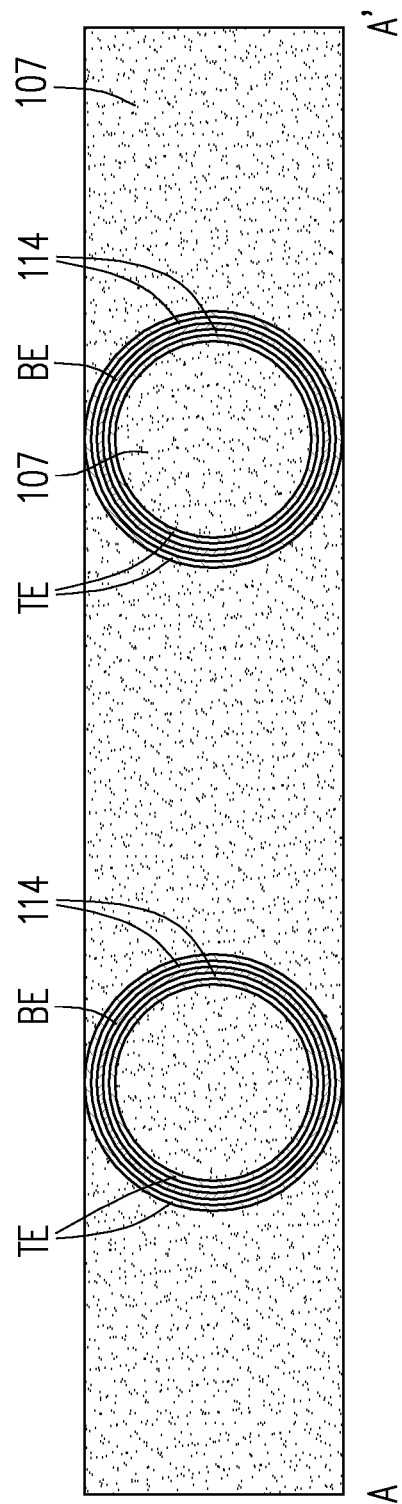

Referring to FIG. 3C the same steps illustrated in FIG. 1E to FIG. 1I may be performed to form the cylindrical back electrode BE, the dielectric layer 114 and the top electrode TE to form the capacitor CP of the same semiconductor device 100. Subsequently, referring to FIG. 3D and FIG. 3E, conductive layers 107 such as SiGe and/or tungsten (W) may be used to fill up the gaps between the capacitor CP and the supporting structure 106'. Up to here, the semiconductor device 100 according to a third embodiment of the present disclosure is accomplished.

Similar to the previous embodiments, since the cylindrical bottom electrode BE is formed with protruding portions BE-PT and concaved portions BE-CV, and the dielectric layer 114 and top electrode TE are conformally formed over the inner and outer surfaces of the cylindrical bottom electrode BE, the formed capacitor CP (MIM structure) may have a significantly increased surface area. As such, a capacitance of the capacitor CP in the semiconductor device 100 may be significantly increased, and the refresh performance of the semiconductor device 100' (e.g. DRAM device) may be improved.

In the above-mentioned embodiments, the semiconductor device includes at least a landing pad and a capacitor disposed on and electrically connected to the landing pad. The capacitor is formed with a cylindrical bottom electrode with protruding portions at the inner surface and concaved portions at the outer surface. As such, when forming the dielectric layer and the top electrode on both the inner and outer surfaces of the cylindrical bottom electrode, a significant surface area enhancement may be achieved from both sides of the cylindrical capacitor. Overall, the capacitance of the capacitor in the semiconductor device may be significantly increased, and the refresh performance of the semiconductor device (e.g. DRAM device) may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
   a landing pad;
   a capacitor disposed on and electrically connected to the landing pad, wherein the capacitor comprises:
      a cylindrical bottom electrode disposed on and in contact with the landing pad, wherein an inner surface of the cylindrical bottom electrode comprises a plurality of protruding portions, and an outer surface of the cylindrical bottom electrode comprises a plurality of concaved portions, wherein a portion where the cylindrical bottom electrode is in direct contact with the landing pads has a flat inner surface and a flat outer surface;
      a dielectric layer conformally disposed on the inner surface and the outer surface of the cylindrical bottom electrode, and covering the plurality of protruding portions and the plurality of concaved portions of the cylindrical bottom electrode; and
      a top electrode conformally disposed on the dielectric layer over the inner surface and the outer surface of the cylindrical bottom electrode;
   a supporting structure supporting the capacitor from the outer surface of the cylindrical bottom electrode; and
   a plurality of island structures sandwiched between the supporting structure and the outer surface of the cylindrical bottom electrode.

2. The semiconductor device according to claim 1, wherein the plurality of protruding portions is separated from one another, and the plurality of concaved portions is separated from one another.

3. The semiconductor device according to claim 1, wherein the supporting structure includes a first portion that supports a bottom section of the cylindrical bottom electrode, and a second portion that supports a middle section of the cylindrical bottom electrode.

4. The semiconductor device according to claim 1, wherein the plurality of island structures is made of titanium or silicon oxide.

5. A method of fabricating a semiconductor device, comprising:
   providing a landing pad;
   alternatingly forming supporting layers and oxide layers over the landing pad;
   patterning the supporting layers and the oxide layers to form a cylindrical opening, wherein the supporting layers are patterned to form a supporting structure;
   forming a plurality of island structures over the supporting structure and the oxide layers, and on sidewalls of the cylindrical opening;
   conformally forming a conductive layer over the plurality of island structures and within the cylindrical opening;
   patterning the conductive layer to form a cylindrical bottom electrode, wherein an inner surface the cylindrical bottom electrode comprises a plurality of protruding portions, and an outer surface of the cylindrical bottom electrode comprises a plurality of concaved portions;
   stripping off the oxide layers and removing the plurality of island structures not covered by the supporting structure, wherein the step of stripping off the oxide layers and removing the plurality of island structures comprises performing a single etching process to remove the oxide layers along with the plurality of island structures;
   conformally forming a dielectric layer on the inner surface and the outer surface of the cylindrical bottom electrode, and covering the plurality of protruding portions and the plurality of concaved portions of the cylindrical bottom electrode; and
   conformally forming a top electrode on the dielectric layer over the inner surface and the outer surface of the cylindrical bottom electrode.

6. The method according to claim 5, wherein the plurality of island structures is made of silicon oxide.

7. The method according to claim 5, wherein the plurality of island structures is made of titanium, and the plurality of island structures are oxidized to form titanium oxide.

8. The method according to claim 5, wherein the plurality of island structures is formed on sidewalls of the cylindrical opening and on the landing pad, and the plurality of island structure located on the landing pad is removed prior to forming the conductive layer.

9. The method according to claim 5, wherein the plurality of island structures is selectively formed on sidewalls of the cylindrical opening, and not formed on the landing pad.

10. The method according to claim 5, wherein the plurality of island structures is formed by chemical vapor deposition or atomic layer deposition.

* * * * *